US008103005B2

(12) United States Patent
Goodwin et al.

(10) Patent No.: US 8,103,005 B2
(45) Date of Patent: Jan. 24, 2012

(54) PRIMARY-AMBIENT DECOMPOSITION OF STEREO AUDIO SIGNALS USING A COMPLEX SIMILARITY INDEX

(75) Inventors: Michael M. Goodwin, Scotts Valley, CA (US); Carlos Avendano, Campbell, CA (US)

(73) Assignee: Creative Technology Ltd, Singapore (SG)

( * ) Notice: Subject to any disclaimer, the term of this patent is extended or adjusted under 35 U.S.C. 154(b) by 825 days.

(21) Appl. No.: 12/196,254

(22) Filed: Aug. 21, 2008

(65) Prior Publication Data

US 2009/0198356 A1 Aug. 6, 2009

Related U.S. Application Data

(60) Provisional application No. 61/026,108, filed on Feb. 4, 2008.

(51) Int. Cl.
*H03G 5/00* (2006.01)
*H04R 5/02* (2006.01)

(52) U.S. Cl. .......... 381/10; 381/1

(58) Field of Classification Search .......... 381/1–10
See application file for complete search history.

(56) References Cited

U.S. PATENT DOCUMENTS

2008/0175394 A1* 7/2008 Goodwin .......... 381/1
2008/0205676 A1* 8/2008 Merimaa et al. .......... 381/310

* cited by examiner

*Primary Examiner* — Cuong Q Nguyen

(57) ABSTRACT

An audio signal is processed to derive primary and ambient components of the signal. The signal is first transformed to generate frequency-domain subband signals. Primary and ambient components are separated by comparing frequency subband content using a complex-valued similarity metric, wherein one of the primary and ambient components is determined to be the residual after the other is identified using the similarity metric.

20 Claims, 4 Drawing Sheets

PRIMARY-AMBIENT DECOMPOSITION OF STEREO AUDIO SIGNALS USING A COMPLEX SIMILARITY INDEX

CROSS-REFERENCES TO RELATED APPLICATIONS

This application is related to U.S. patent application Ser. No. 12/048,156, filed on Mar. 13, 2008 and now pending, which is entitled Vector-Space Methods for Primary-Ambient Decomposition of Stereo Audio Signals, the specification of which is incorporated herein by reference in its entirety. Further, this application claims priority to and the benefit of the disclosure of U.S. Provisional Patent Application Ser. No. 61/026,108, filed on Feb. 4, 2008, and entitled "Primary-Ambient Decomposition of Stereo Audio Signals Using a Complex Similarity Index", the entire specification of which is incorporated herein by reference in its entirety.

BACKGROUND OF THE INVENTION

1. Field of the Invention

The present invention relates to signal processing techniques. More particularly, the present invention relates to methods for decomposing audio signals using similarity metrics.

2. Description of the Related Art

Primary-ambient decomposition algorithms separate the reverberation (and diffuse, unfocussed sources) from the primary coherent sources in a stereo or multichannel audio signal. This is useful for audio enhancement (such as increasing or decreasing the "liveliness" of a track), upmix (for example, where the ambience information is used to generate synthetic surround signals), and spatial audio coding (where different methods are needed for primary and ambient signal content).

Current methods determine the similarity of audio channels based on a real-valued similarity metric, and use that metric to estimate primary and/or ambient components. Unfortunately, these techniques sometimes result in artifacts in the audio rendering. What is desired is an improved primary-ambient decomposition technique.

SUMMARY OF THE INVENTION

The invention describes techniques that can be used to avoid the aforementioned artifacts incurred in prior methods. The invention provides a new method for computing a decomposition of a stereo audio signal into primary and ambient components. Post-processing methods for improving the decomposition are also described.

In accordance with one embodiment, a method for processing a stereo audio stereo signal to derive primary and ambient components of the signal is provided. Initially, the audio signal is transformed to the frequency domain, transforming left and right channels of the audio signal to corresponding frequency-domain subband vectors. The primary and ambient components are then determined by comparing frequency subband content using a complex-valued similarity metric, wherein one of the primary and ambient components is determined to be the residual after the other is identified using the similarity metric.

These and other features and advantages of the present invention are described below with reference to the drawings.

DETAILED DESCRIPTION OF PREFERRED EMBODIMENTS

Figure 1:
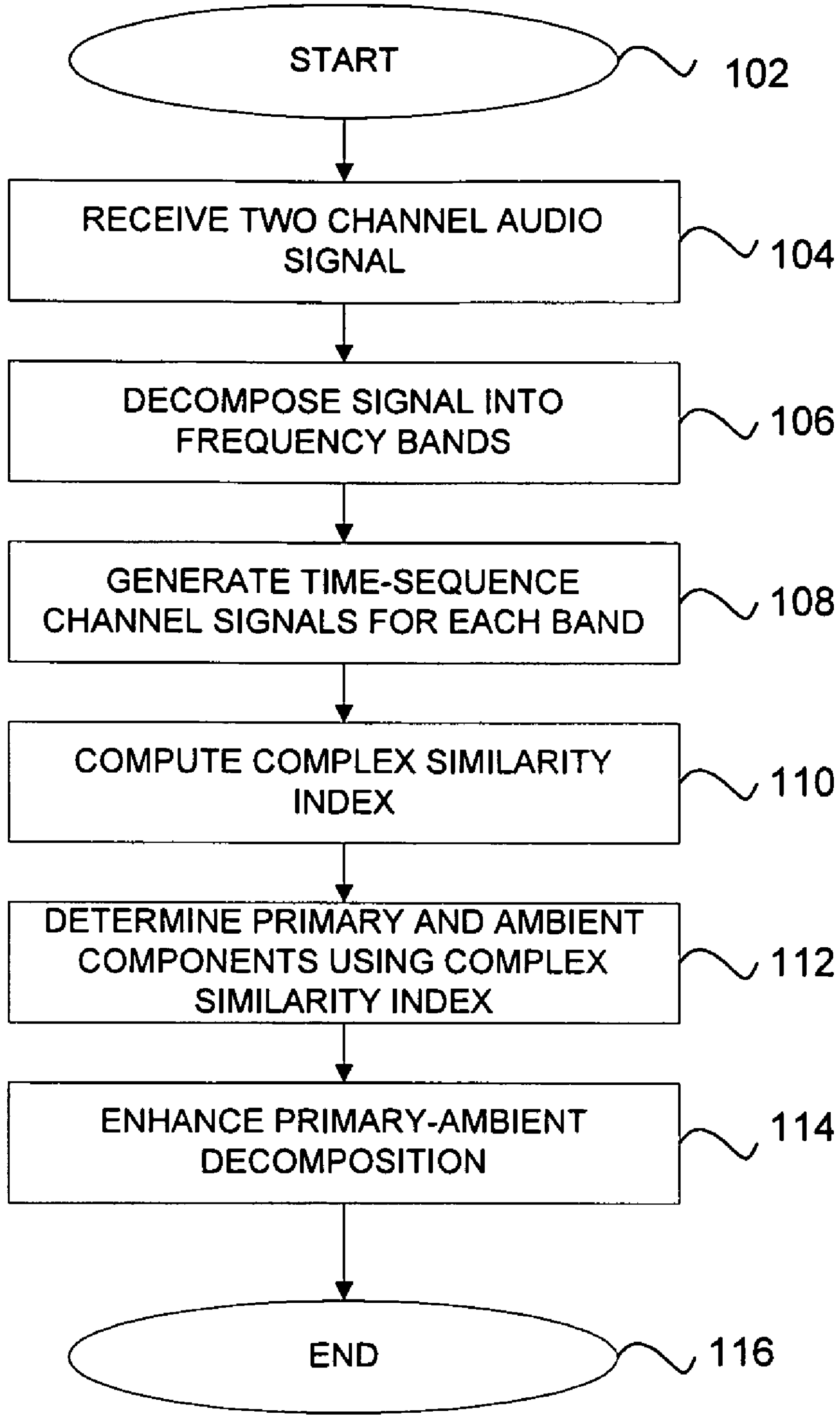
FIG. 1 is a flowchart illustrating a method of decomposing a stereo audio signal into primary and ambient components in accordance with one embodiment of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known mechanisms have not been described in detail in order not to unnecessarily obscure the present invention.

It should be noted herein that throughout the various drawings like numerals refer to like parts. The various drawings illustrated and described herein are used to illustrate various features of the invention. To the extent that a particular feature is illustrated in one drawing and not another, except where otherwise indicated or where the structure inherently prohibits its incorporation of the feature, it is to be understood that those features may be adapted to be included in the embodiments represented in the other figures, as if they were fully illustrated in those figures. Unless otherwise indicated, the drawings are not necessarily to scale. Any dimensions provided on the drawings are not intended to be limiting as to the scope of the invention but merely illustrative.

The present invention provides improved primary-ambient decomposition of stereo audio signals. The method provides more effective primary-ambient decomposition than previous approaches, and is especially effective for extraction of vocal content. In accordance with a first embodiment, primary-ambient decomposition is performed on an audio signal using a complex metric for evaluating signal similarity. This method using complex metrics provide improved results over previous methods that use real-valued metrics.

The primary-ambient decomposition methods described may be used in various embodiments as follows: for upmix applications, the ambient components can be used for synthetic surround generation, and the primary frontal (especially center-panned) components can be used to generate a synthetic center channel; for surround enhancement or enhanced listener immersion, the ambient and/or primary components may be modified for improved or customized rendering; for headphone listening, different virtualization and/or modification may be carried out on the primary and ambient components so as to improve the sense of externalization; for spatial coding/decoding, the separation of primary and ambient components improves the spatial analysis/synthesis process and also improves matrix encode/decode; for karaoke applications, the primary voice components can be removed to enable karaoke with arbitrary music; for source enhancement, primary sources can be separated and modified prior to reintegration and/or rendering—for instance, a discretely panned voice can be extracted, processed to improve its clarity or presence, and then reintroduced in the mix. Those of skill in the relevant art will recognize that these serve as examples of useful applications of primary-ambient decomposition and that the invention is applicable to other scenarios not specifically listed here.

Extraction of primary panned components based on a real-valued similarity metric has been considered in previous work. For some spatial audio processing algorithms previously described, this is used in conjunction with ambience extraction, e.g. for upmix; in those methods, the ambience extraction is carried out in a separate step based on a different signal analysis metric. The current work is novel in at least two key respects: first, the similarity metric used for extraction of primary panned components is complex-valued instead of real-valued; and second, in several embodiments, ambience extraction and panned-source extraction are carried out simultaneously to derive a primary-ambient decomposition wherein the sum of the primary and ambient components equals the original signal.

Mathematical Foundations

The mathematical notation to be used in specifying the current work is given below:

$$\|\vec{X}\|=(\vec{X}^H\vec{X})^{1/2} \text{ (vector magnitude, where the superscript } H \text{ denotes the conjugate transpose)} \quad (1)$$

$$r_{LR}=\vec{X}_L^H\vec{X}_R \text{ (correlation)} \quad (2)$$

$$r_{LL}=\vec{X}_L^H\vec{X}_L \text{ (autocorrelation)} \quad (3)$$

$$r_{RR}=\vec{X}_R^H\vec{X}_R \text{ (autocorrelation)} \quad (4)$$

$$r_{LR}(t)=\lambda r_{LR}(t-1)+(1-\lambda)X_L(t)^*X_R(t) \text{ (running correlation, where } X_i(t) \text{ is the new sample at time } t \text{ of the vector } \vec{X}_i) \quad (5)$$

$$\phi_{LR}=\frac{r_{LR}}{(r_{LL}r_{RR})^{1/2}} \quad \text{(correlation coefficient)} \quad (6)$$

$$S_{LR}=\frac{2\|\vec{X}_L\|\|\vec{X}_R\|}{\|\vec{X}_L\|^2+\|\vec{X}_R\|^2} \quad \text{(real similarity index)} \quad (7)$$

$$\begin{aligned}\psi_{LR}&=\frac{2\vec{X}_L^H\vec{X}_R}{\|\vec{X}_L\|^2+\|\vec{X}_R\|^2} \quad \text{(complex similarity index)}\\&=\frac{2r_{LR}}{r_{LL}+r_{RR}}\\&=|\psi_{LR}|e^{j\angle\psi_{LR}}\end{aligned} \quad (8)$$

$$\psi_{LR}=\left(\frac{2\|\vec{X}_L\|\|\vec{X}_R\|}{\|\vec{X}_L\|^2+\|\vec{X}_R\|^2}\right)\phi_{LR}=S_{LR}\phi_{LR} \quad (9)$$

$$\left(\frac{\vec{Y}^H\vec{X}}{\vec{Y}^H\vec{Y}}\right)\vec{Y}=\left(\frac{r_{YX}}{r_{YY}}\right)\vec{Y}=\left(\frac{r_{XY}^*}{r_{YY}}\right)\vec{Y} \quad \text{(projection of } \vec{X} \text{ onto } \vec{Y}) \quad (10)$$

Notes on the Mathematics

In embodiments of the present invention based on the mathematical formulations given above, the signals are treated as vectors in time; when a time-domain signal $x_i[n]$ is transformed (e.g. by the STFT) into a time-frequency representation $X_i[m,k]$ where m is a time index and k is a frequency index, there is a vector $\vec{X}_i$ for each transform index k. In principle, any complex-valued signal decomposition could be used for the transformation and the scope of the present invention is intended in various embodiments to include such various complex-valued signal decompositions. The length of the signal vectors used in the computations is a design parameter: that is, in various embodiments, the vectors could be instantaneous values or could have a static or dynamic length; or, the vectors and vector statistics could be formed by recursion as shown in Eq. (5); an embodiment employing recursive formulation is especially useful for efficient inner product computations. For instantaneous values, the vector magnitude is the absolute value. Lastly, it should be noted that orthogonality of vectors in signal space is equivalent to decorrelation of the corresponding time sequences.

In accordance with a first embodiment for separation of primary and ambient signal components, the similarity between the channels is first computed for each time and frequency indexed in the signal representation. For each time and frequency, the similarity metric indicates whether a primary source is panned between the channels or whether the components consist of ambience. A complex similarity index is used such that the magnitude and phase relationships of the input signals are captured; the magnitude and phase are thus both used to determine the primary and ambient components.

The primary-ambient decomposition algorithm is carried out as follows. First, the signal is transformed from the time domain to a complex-valued time-frequency representation:

$$x_i[n]\rightarrow X_i[m,k] \quad (11)$$

Then, the cross-correlation and auto-correlations are computed for each time and frequency; these are denoted as $r_{LR}[m,k]$, $r_{LL}[m,k]$, $r_{RR}[m,k]$ where the subscript L indicates one of the input channel signals and the subscript R indicates the other. Although the subscripts L and R are used in this description, the current invention may be used not only on stereo signals but on any two channels from a multichannel signal. For each transform component k (at each time frame m), the complex similarity index $\psi_{LR}[m,k]$ is computed using Eq. (8), or alternatively in some embodiments Eq. (9). The division in the computation of $\psi_{LR}[m,k]$ is protected against singularities (division by zero) by threshold testing: if $r_{LL}[m,k]+r_{RR}[m,k]<\epsilon$, then the assignment $\psi_{LR}[m,k]=0$ is made. Based on the magnitude and phase of $\psi_{LR}[m,k]$, the transform component $X_i[m,k]$ is then separated into primary and ambient components; this involves specifying a region $\psi_0$ in the complex plane. The specified region $\psi_0$ can be used to determine the primary and ambient components of $X_i[m,k]$ either using a hard-decision approach or a soft-decision approach. In the hard-decision approach each transform component $X_i[m,k]$ is categorized as primary or ambient based on whether $\psi_{LR}[m,k]$ is within the specified region $\psi_0$. If $\psi_{LR}[m,k]\in\psi_0$, namely if the computed complex similarity index for time m and frequency k is within the specified region $\psi_0$, then the component $X_i[m,k]$ is deemed to be primary; the ambience component is set to zero and the primary component is set equal to the signal:

$$A_i[m,k]=0,\ P_i[m,k]=X_i[m,k]. \quad (12)$$

However, if $\psi_{LR}[m,k]\notin\psi_0$, $X_i[m,k]$ is deemed to be ambient; the ambience component is set to equal the signal and the primary component is set to zero:

$$A_i[m,k]=X_i[m,k],\ P_i[m,k]=0. \quad (13)$$

In the soft-decision approach, each transform component $X_i[m,k]$ is apportioned into primary and ambient components based on the location of $\psi_{LR}[m,k]$ with respect to the specified region $\psi_0$. A weighting function $\alpha_i[m,k]$ is determined from $\psi_{LR}$[m,k] and the parameters that specify the region $\psi_0$. In one example of a soft-decision weighting function, the region $\psi_0$ consists of the entire unit circle in the complex plane; the value of the weighting function is 1 if the magnitude of $\psi_{LR}$[m,k] is 0 or if its angle is $\pi$, and is otherwise tapered:

$$\alpha_i[m,k] = 1 - |\psi_{LR}[m,k]|\left(1 - \frac{\angle\psi_{LR}[m,k]}{\pi}\right). \tag{14}$$

In another example of a soft-decision weighting function, the region $\psi_0$ is specified in terms of a radius $r_0$ and an angle $\theta_0$, which could be tuned (by a user, a sound designer, or automatically) to best achieve a desired effect, and the weighting function is specified as:

$$\alpha_i[m,k] = 1 - \exp\left[-\left(\frac{\angle\psi_{LR}[m,k]}{\theta_0}\right)^2 - \left(\frac{1-|\psi_{LR}[m,k]|}{1-r_0}\right)^2\right]. \tag{15}$$

These weighting functions are offered as examples; the invention is not limited in this regard and it will be understood by those of skill in the art that other weighting functions are within the scope of the invention.

After $\alpha_i$[m,k] is computed using either of the above example formulations or some other suitable formulation, the ambience component is preferably derived by multiplication and the primary component preferably by a subsequent subtraction:

$$A_i[m,k]=\alpha_i[m,k]X_i[m,k] \tag{16}$$

$$P_i[m,k]=X_i[m,k]-A_i[m,k] \tag{17}$$

Alternately, in other embodiments, a weighting function $\beta_i$[m,k] could be constructed so as to estimate the primary component, and the ambience component would then be computed by a subtraction:

$$P_i[m,k]=\beta_i[m,k]X_i[m,k] \tag{18}$$

$$A_i[m,k]=X_i[m,k]-P_i[m,k]. \tag{19}$$

As a last step in the primary-ambient decomposition, one or more optional post-processing operations may be carried out to enhance the decomposition.

By setting $\lambda$=0 in the recursive computation of the autocorrelations and cross-correlations ($r_{LR}$[m,k], $r_{LL}$[m,k], $r_{RR}$[m,k]) the complex similarity index $\psi_{LR}$[m,k] can be computed as an instantaneous value only dependent on the signal values in the m-th time frame. Setting $\lambda$ to a value greater than 0 (but less than 1) has the effect of incorporating the signal history in the computation. Such signal tracking tends to improve the performance of the primary-ambient separation.

As shown earlier in Eq. (9), the complex similarity index can be expressed as the product of a real similarity measure and the complex correlation coefficient: $\psi_{LR}$[m,k]=$S_{LR}$[m,k] $\phi_{LR}$[m,k]. To handle signal dynamics, it maybe useful to have different time constants (different values of $\lambda$) in the recursive computations of the similarity index and correlation coefficient components.

In other embodiments, a complex-valued similarity metric other than the previously defined $\psi_{LR}$[m,k] may be incorporated in the primary-ambient decomposition algorithm, for instance a time-average of an instantaneous complex similarity metric.

With respect to prior methods, key differences include the cross-channel comparison metric, the design of the extraction functions, and the use of the phase in the primary-ambient decision. The real-valued similarity index has been used in previous center-channel extraction methods.

FIG. 1 is a flowchart illustrating primary-ambient separation using a complex similarity index in accordance with one embodiment of the present invention. The process commences at operation 102. At operation 104 a two channel audio signal is received by the processing device. Next, at operation 106, using techniques known to those of ordinary skill in the relevant art, the signal is decomposed into frequency subbands. Applying a window to the signal and a Fourier Transform to the windowed signal decomposes the signal into frequency subbands in a preferred embodiment. For each frequency subband of each input channel signal, a time-sequence vector is generated in operation 108. Next, in operation 110, the complex similarity index is computed for each subband. In operation 112, each channel vector is decomposed into primary and ambient components using the complex-valued similarity metric.

At operation 114, an optional enhancement of the primary and/or ambient signal components is performed. For example, the original signal (in each frequency band) may be projected back onto the direction (in signal space) for the derived primary component to generate a modified primary component that has fewer audible artifacts. The process ends at operation 116.

Figure 2:
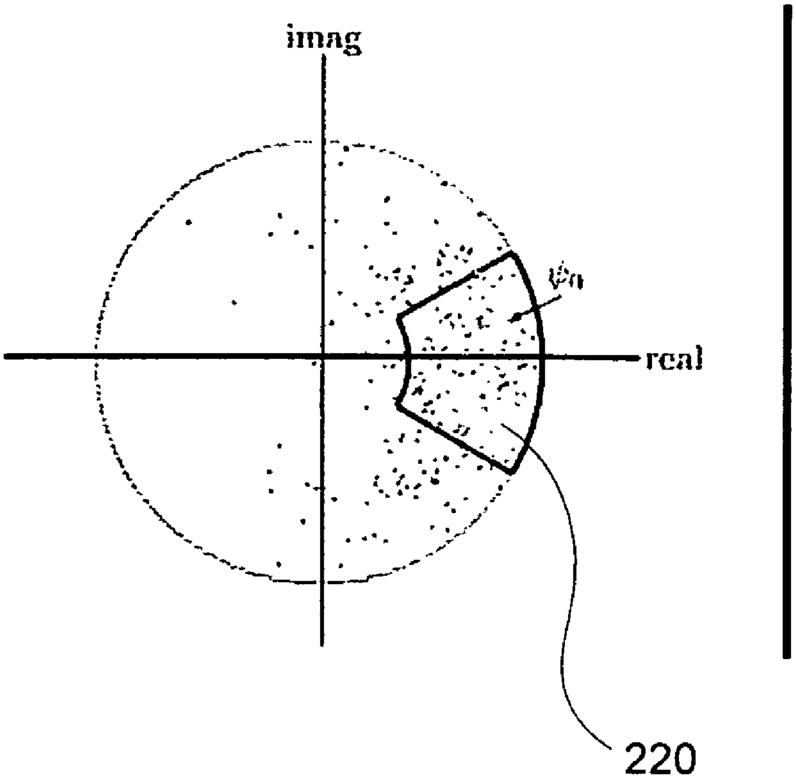
FIG. 2 is a diagram illustrating primary-ambient separation using a complex similarity index in accordance with one embodiment of the present invention.

FIG. 2 is a diagram illustrating primary-ambient separation using a complex similarity index in accordance with one embodiment of the present invention. In particular, FIG. 2 depicts a scatter plot of complex similarity index values for the transformed signal components in a signal frame. The figure depicts the hard-decision approach. Points inside the indicated $\psi_0$ region (220) are deemed to correspond to primary components; points outside the region are deemed to be ambience.

Figure 3:
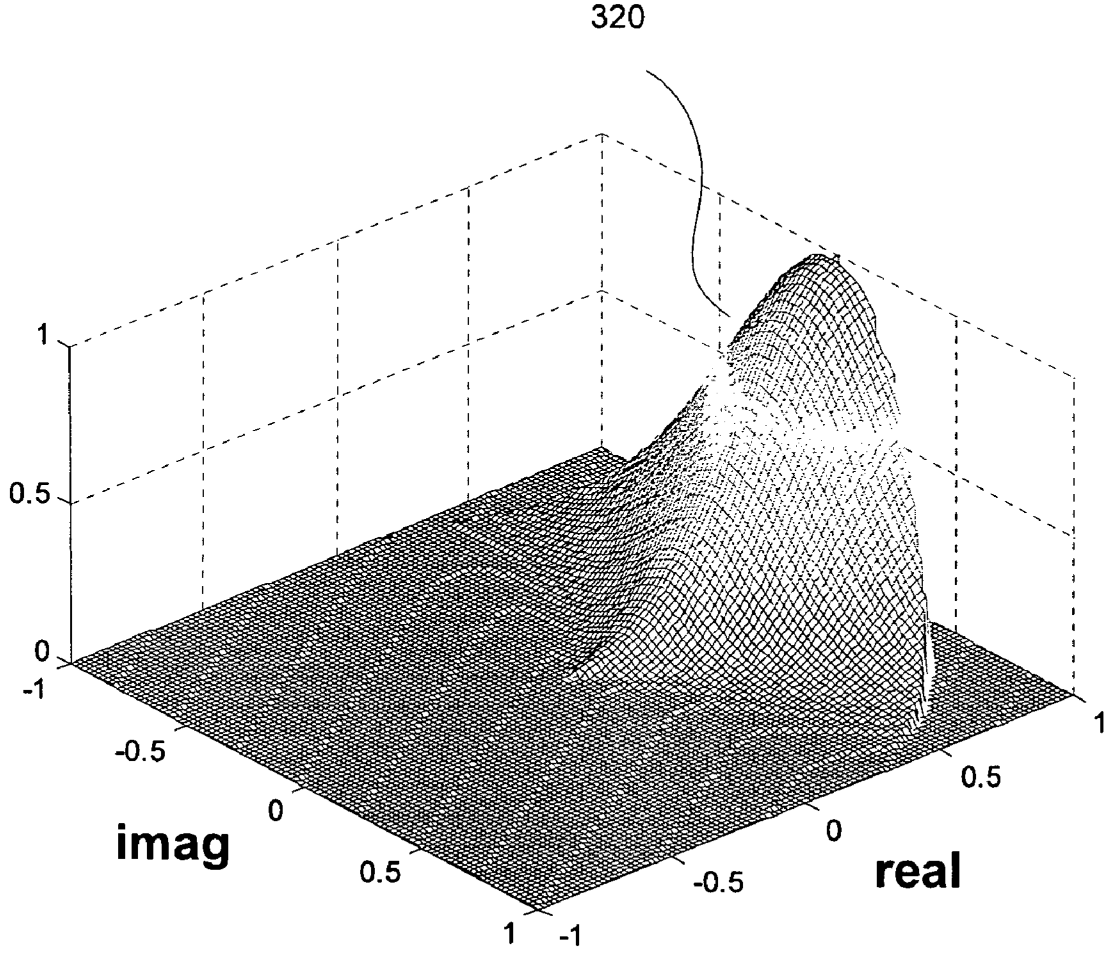
FIG. 3 is a diagram illustrating a soft-decision function for primary-ambient separation using a complex similarity index in accordance with one embodiment of the present invention.

FIG. 3 is a diagram illustrating primary-ambient separation using a complex similarity index in accordance with one embodiment of the present invention. In particular, FIG. 3 depicts a soft-decision weighting function (320) in accordance with Eq. (15) for values $r_0$=0.5 and $$\theta_0 = \frac{\pi}{6}.$$

For ease of visualization, the soft-decision weighting function depicted is the complement of that given in Eq. (15), namely $$\beta_i[m,k] = \exp\left[-\left(\frac{\angle\psi_{LR}[m,k]}{\theta_0}\right)^2 - \left(\frac{1-|\psi_{LR}[m,k]|}{1-r_0}\right)^2\right]. \tag{20}$$

This is a soft-decision weighting function suitable for extracting primary components as explained above in conjunction with Eqs. (18) and (19). The signal at time m and frequency k is apportioned into primary and ambient components based on the value of the soft-decision function at the point in the complex plane corresponding to $\psi_{LR}$[m,k].

Figure 4:
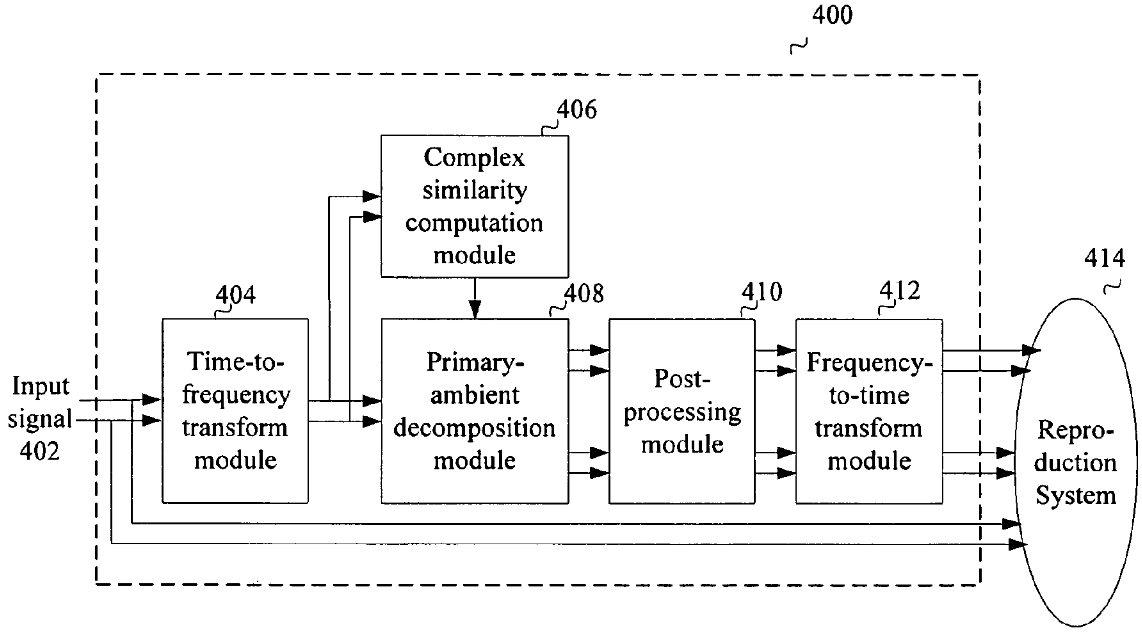
FIG. 4 illustrates a system for decomposing an input signal into primary and ambient components in accordance with various embodiments of the present invention.

FIG. 4 is a block diagram depicting a system 400 for separating an input signal into primary and ambient components in accordance with embodiments of the present invention. A signal 402 is provided as input to system 400. The signal may comprise two or more channels although only two lines are depicted. In some embodiments, the system 400 may be configured to operate on two channels selected from a multichannel signal comprising more than two channels. In block 404, the two input channel signals are converted to preferably complex-valued time-frequency representations, for example using the STFT. The time-frequency representations are provided to block 406, which computes the complex similarity metric in accordance with Eq. (8) or Eq. (9). The time-frequency representations and the complex similarity index are provided as inputs to block 408. Block 408 in turn separates the time-frequency representations for the respective channels into primary and ambient components in accordance with methods described earlier, either via a hard-decision or a soft-decision approach. The primary and ambient components for the respective channels determined in block 408 are supplied as inputs to block 410, wherein optional post-processing operations are carried out in accordance with embodiments of the present invention to be elaborated in the following. The optionally post-processed primary and ambient components are subsequently converted from time-frequency representations into time-domain representations by time-to-frequency transform module 412. The time-domain primary and ambient components and the original input signal 402 (which in some embodiments may comprise more than the two channels depicted) are provided to reproduction system 414.

It will be appreciated by those skilled in the art that system 400 can be configured to include some or all of these modules as well as be integrated with other systems, e.g., reproduction system 414, to produce an audio system for audio playback. It should be noted that various parts of system 400 can be implemented in computer software and/or hardware. For instance, modules 404, 406, 408, 410, 412 can be implemented as program subroutines that are programmed into a memory and executed by a processor of a computer system. Further, modules 404, 406, 408, 410, 412 can be implemented as separate modules or combined modules.

Reproduction system 414 may include any number of components for reproducing the processed audio from system 400. As will be appreciated by those skilled in the art, these components may include mixers, converters, amplifiers, speakers, etc. According to various embodiments of the present invention, the primary and ambience components are separately distributed for playback. For example, in a multichannel loudspeaker system, some ambience is sent to the surround channels; or, in a headphone system, the ambience may be virtualized differently than the primary components. In this way, the sense of immersion in the listening experience can be enhanced. To further enhance the listening experience, in some embodiments the ambience component is boosted in the reproduction system 414 prior to playback.

Post-Processing for Improved Separation and Artifact Reduction

In accordance with further embodiments of the present invention, a number of post-processing operations can selectively be combined with the primary-ambient decomposition to reduce processing artifacts and/or improve the quality of the primary-ambient signal separation.

Signal Leakage into Extracted Components

According to one embodiment, the derived primary and ambient components are augmented with an attenuated version of the original signal. To hide artifacts, it is useful to add a small amount of the original signal into the extracted components; this process can be referred to as "leaking" the original signal into the extracted components. Starting with an initial primary-ambient decomposition for channel i given by $$X_i[m,k]=P_i[m,k]+A_i[m,k], \quad (21)$$

the augmentation process corresponds to deriving modified components according to $$\hat{A}_i[m,k]=A_i[m,k]+cX_i[m,k] \quad (22)$$

$$\hat{P}_i[m,k]=P_i[m,k]+dX_i[m,k] \quad (23)$$

where c and d are small gains, on the order of 0.05 in some embodiments. In some embodiments, only one of the primary or ambient components is modified in this manner; that is, one of c or d can be set to zero in some embodiments within the scope of this invention. Those of skill in the art will recognize that the signal leakage expressed in Eqs. (22) and (23) can be equivalently written as $$\hat{A}_i[m,k]=(1+c)A_i[m,k]+cP_i[m,k] \quad (24)$$

$$\hat{P}_i[m,k]=(1+d)P_i[m,k]+dA_i[m,k]. \quad (25)$$

Those of skill in the art will further understand that it is within the scope of this invention to carry out a similar augmentation process consisting of leaking part of the primary component into the ambient component (and vice versa), as in $$\hat{A}_i[m,k]=A_i[m,k]+eP_i[m,k] \quad (26)$$

$$\hat{P}_i[m,k]=P_i[m,k]+fA_i[m,k] \quad (27)$$

where e and f are small gains, on the order of 0.05 in some embodiments, and where e or f may be set to zero in some embodiments.

Reprojection: Signal onto Primary

In another embodiment, the primary-ambient decomposition is improved by projecting each channel signal onto the corresponding extracted primary component to derive an enhanced primary component (for each respective channel); the ambient component is recomputed as the projection residual. Using Eq. (10), the projection of the signal onto the primary component is given by $$\vec{P}_i' = \left(\frac{\vec{P}_i^H \vec{X}_i}{\vec{P}_i^H \vec{P}_i}\right)\vec{P}_i = \left(\frac{r_{PX}}{r_{PP}}\right)\vec{P}_i \quad (28)$$

where $r_{PX}$ is the cross-correlation between the initial extracted primary component and the original signal, and where $r_{PP}$ is the autocorrelation of the initial extracted primary component. The projection in Eq. (28) is carried out for each time m and frequency k, although these indices have been omitted here to simplify the notation. In some embodiments, a modified ambience is computed as the projection residual:

$$\vec{A}_i=\vec{X}_i-\vec{P}'_i. \quad (29)$$

Those of skill in the art will understand that the operations in Eqs. (28) and (29) result in an orthogonal primary-ambient decomposition. This embodiment is very effective for reducing artifacts and improving the naturalness of the primary and ambient components.

Reprojection: Primary onto Signal

In an alternative embodiment, the initial primary component estimate is projected back onto the original signal for each channel:

$$\vec{P}_i' = \left(\frac{\vec{X}_i^H \vec{P}_i}{\vec{X}_i^H \vec{X}_i}\right)\vec{X}_i = \left(\frac{r_{XP}}{r_{XX}}\right)\vec{X}_i \quad (30)$$

where $r_{XP}$ is the cross-correlation between the original signal and the initial extracted primary component, and where $r_{XX}$ is the autocorrelation of the original channel signal. The projection in Eq. (30) is carried out for each time m and frequency k, although these indices have been omitted here to simplify the notation. In some embodiments, a modified ambience is computed as the projection residual as in Eq. (29). A correlation analysis shows that this projection operation counteracts a processing artifact of the initial decomposition whereby primary components unintentionally leak into the extracted ambience.

Rejection of Hard-Panned Sources

If a time-frequency component is hard-panned to one channel (i.e. only present in one channel), that component will have a low similarity index and will tend to be deemed ambience by the separation algorithm. Hard-panned sources should not be leaked into the ambience in this way (and should remain in the primary), so if the magnitude of the two channels is sufficiently dissimilar, in one embodiment (based on the soft-decision approach described earlier) it is decided that the signal is hard-panned and the ambience extraction weight $\alpha_i[m,k]$ is scaled down substantially to prevent hard-panned sources from getting extracted as ambience.

Allpass Filtering

According to yet another embodiment, the derived ambient components are further allpass filtered. An allpass filter network can be used to further decorrelate the extracted ambience. This is helpful to enhance the sense of spaciousness and envelopment in the rendering. In upmix applications, the requisite number of ambience channels (for the synthetic surrounds) can be generated by using a bank of mutually orthogonal allpass filters.

Post-Filtering

In accordance with other embodiments, post-filtering steps are performed to enhance the primary-ambient separation. For each channel, the ambience spectrum is derived from the estimated ambience, and its inverse is applied as a weight to the direct spectrum. This post-filtering suppression is effective in some cases to improve direct-ambient separation, i.e. suppression of cross-component leakage. Post-processing filters for source separation have been described in the literature and hence full details are not believed necessary here.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for processing a multichannel audio signal to derive primary and ambient components of the signal, comprising:

transforming at least a first and second channel of the audio signal to corresponding complex-valued time-frequency representations; and determining the primary component and ambient components by comparing frequency subband content using a complex-valued similarity metric, wherein one of the primary and ambient components is determined to be the residual after the other is identified and extracted using the complex-valued similarity metric.

2. The method as recited in claim 1 wherein the multichannel audio signal is a stereo audio signal and wherein transforming at least a first and second channel of the audio signal comprises transforming left and right channels of the audio signal.

3. The method as recited in claim 1 wherein the sum of the primary and ambient components equals the original signal.

4. The method as recited in claim 1 wherein the complex-valued similarity index is determined for each transform component and wherein determining whether the component is primary or ambient is based on the magnitude and phase of the complex-valued similarity index.

5. The method as recited in claim 4 wherein transform components having a similarity index falling inside a predetermined region in the complex plane are deemed to be primary and the remainder of the signal is deemed to constitute ambient components.

6. The method as recited in claim 4 wherein the similarity index $\psi_{LR}$ is defined as $$\frac{2r_{LR}}{r_{LL}+r_{RR}}$$

where $r_{LR}$ represents the correlation of a first or left channel signal with a corresponding second ot right channel signal, $r_{LL}$ represents the autocorrelation of the first or left channel signal, and $r_{RR}$ represents the autocorrelation of the second or right channel signal.

7. The method as recited in claim 1 wherein the determination of primary and ambient components is based on whether the complex similarity index falls within a predetermined region in the complex plane.

8. The method as recited in claim 1 wherein the determination of primary and ambient components is based on determining a value for the primary component using a scaling factor applied to the channel vectors, said scaling factor being derived at least in part from the phase of the similarity index.

9. The method as recited in claim 1 wherein the determination of primary and ambient components is based on determining a value for the primary component using a scaling factor applied to the channel vectors, said scaling factor being derived at least in part from the magnitude of the similarity index.

10. The method as recited in claim 1 wherein the determination of primary and ambient components is based on determining a value for the ambient component using a scaling factor applied to the channel vectors, said scaling factor being derived at least in part from the phase of the similarity index.

11. The method as recited in claim 1 wherein the determination of primary and ambient components is based on determining a value for the ambient component using a scaling factor applied to the channel vectors, said scaling factor being derived at least in part from the magnitude of the similarity index.

12. The method as recited in claim 1 wherein the complex similarity index is a function of the correlation between the vectors for corresponding channels.

13. The method as recited in claim 2 further comprising taking the derived ambient components to synthesize surround-channel signals for stereo-to-multichannel upmix and further comprising using the derived primary components to generate a center-channel signal for stereo-to-multichannel upmix.

14. The method as recited in claim 1 further comprising taking the derived ambient and primary components and performing separate spatial audio coding techniques on the separated components.

15. The method as recited in claim 1 wherein the determination of primary components is configured to extract vocal content and wherein extracting vocal content comprises determining the center-panned components of the original signal.

16. The method as recited in claim 1 further comprising deriving an enhanced primary component as a result of projecting the original signal onto the derived primary signal and determining the ambient component as the projection residual.

17. The method as recited in claim 1 further comprising leaking a small amount of the original signal into the extracted primary and ambience components to reduce artifacts.

18. The method as recited in claim 1 further comprising taking the derived (extracted) ambience components, and applying allpass filtering to them to further decorrelate the extracted ambience.

19. The method as recited in claim 1 further comprising taking the derived (extracted) ambience components, determining the inverse of the spectrum of the estimated ambience and applying the inverse of the ambience spectrum as a weight to the extracted primary components.

20. A method for processing a stereo audio stereo signal to derive primary and ambient components of the signal, comprising:

transforming left and right channels of the audio signal to corresponding frequency-domain subband vectors;

determining the similarity between the channel vectors using a complex-valued similarity index applied to the vectors representing the transformed audio signal; and determining the primary and ambient components based on the value of the complex similarity index.

* * * * *